(12) United States Patent
Piehl et al.

(10) Patent No.: US 7,370,185 B2
(45) Date of Patent: *May 6, 2008

(54) SELF-PACKAGED OPTICAL INTERFERENCE DISPLAY DEVICE HAVING ANTI-STICTION BUMPS, INTEGRAL MICRO-LENS, AND REFLECTION-ABSORBING LAYERS

(75) Inventors: Arthur Piehl, Corvallis, OR (US); James R. Przybyla, Philomath, OR (US); Adam L Ghozeil, Corvallis, OR (US); Eric T. Martin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 737 days.

This patent is subject to a terminal disclaimer.

(21) Appl. No.: 10/428,247

(22) Filed: Apr. 30, 2003

(65) Prior Publication Data

US 2004/0217919 A1  Nov. 4, 2004

(51) Int. Cl.
*G02B 26/00* (2006.01)
*G02F 1/03* (2006.01)

(52) U.S. Cl. .................. 713/1; 359/260; 359/290; 359/291; 359/293

(58) Field of Classification Search ................ 713/300, 713/1; 359/238, 245, 254, 260, 290, 291, 359/293
See application file for complete search history.

(56) References Cited

U.S. PATENT DOCUMENTS

| 5,181,013 A | 1/1993 | Bagshaw et al. |
| 5,771,321 A | 6/1998 | Stern |
| 5,835,255 A | 11/1998 | Miles |
| 5,986,796 A | 11/1999 | Miles |
| 6,031,653 A * | 2/2000 | Wang .......................... 359/247 |
| 6,040,936 A | 3/2000 | Kim et al. |
| 6,040,937 A | 3/2000 | Miles |
| 6,117,699 A * | 9/2000 | Lemoff et al. ................ 438/35 |
| 6,154,591 A | 11/2000 | Kershaw |
| 6,195,196 B1 | 2/2001 | Kimura et al. |
| 6,252,703 B1 * | 6/2001 | Nakamura et al. .......... 359/360 |
| 6,373,632 B1 | 4/2002 | Flanders |
| 6,381,022 B1 | 4/2002 | Zavracky |
| 6,384,953 B1 * | 5/2002 | Russell et al. .............. 359/245 |

(Continued)

FOREIGN PATENT DOCUMENTS

EP   1 139 159   10/2001

(Continued)

*Primary Examiner*—A. Elamin

(57) ABSTRACT

An electronic device of an embodiment of the invention is disclosed that at least partially displays a pixel of a display image. The device includes a first reflector and a second reflector defining an optical cavity therebetween that is selective of a visible wavelength at an intensity. The device includes a mechanism to allow optical properties of the cavity to be varied such that the visible wavelength and/or the intensity are variably selectable in correspondence with the pixel of the displayable image. The device also includes one or more transparent deposited films, one or more absorbing layers, an integral micro-lens, and/or one or more anti-stiction bumps. The deposited films are over one of the reflectors, for self-packaging of the device. The absorbing layers are over one of the reflectors, to reduce undesired reflections. The integral micro-lens is over one of the reflectors, and the anti-stiction bumps are between the reflectors.

31 Claims, 10 Drawing Sheets

U.S. PATENT DOCUMENTS

| | | |
|---|---|---|
| 6,392,341 B2 | 5/2002 | Jacobsen et al. |
| 6,466,285 B1 * | 10/2002 | Ichikawa ..................... 349/95 |
| 6,650,455 B2 * | 11/2003 | Miles ........................ 359/237 |
| 6,724,796 B2 * | 4/2004 | Hwang et al. ............. 372/50.1 |
| 6,768,555 B2 * | 7/2004 | Chen et al. ................. 356/519 |
| 6,829,132 B2 * | 12/2004 | Martin et al. ............... 361/278 |
| 6,833,958 B2 * | 12/2004 | Rankin et al. .............. 359/580 |
| 6,853,476 B2 * | 2/2005 | Martin et al. ............... 359/290 |
| 6,864,933 B2 * | 3/2005 | Broer et al. ................ 349/105 |
| 6,865,315 B2 * | 3/2005 | Hulse .......................... 385/27 |
| 7,221,497 B2 * | 5/2007 | Piehl et al. ................. 359/290 |
| 2002/0015215 A1 | 2/2002 | Miles |
| 2002/0024711 A1 | 2/2002 | Miles |
| 2002/0036828 A1 | 3/2002 | Wong |
| 2002/0054424 A1 | 5/2002 | Miles |
| 2002/0126864 A1 | 9/2002 | Miles |
| 2002/0135909 A1 * | 9/2002 | Rankin et al. .............. 359/856 |
| 2003/0189711 A1 * | 10/2003 | Orr et al. .................... 356/484 |

FOREIGN PATENT DOCUMENTS

| | | |
|---|---|---|
| EP | 1 146 325 A2 | 10/2001 |
| WO | WO 02/091059 | 11/2002 |

\* cited by examiner

SELF-PACKAGED OPTICAL INTERFERENCE DISPLAY DEVICE HAVING ANTI-STICTION BUMPS, INTEGRAL MICRO-LENS, AND REFLECTION-ABSORBING LAYERS

BACKGROUND

Nearly all conventional displays are active in nature. This means that power must continually be supplied to the displays for them to maintain the images they are displaying. Such conventional displays include direct view and projection cathode-ray tube (CRT) displays, direct view and projection liquid crystal displays (LCD's), direct view plasma displays, projection digital light processing (DLP) displays, and direct view electroluminescent (EL) displays, among others.

Since power must continually be supplied to these types of displays, they can be a significant cause of power usage in devices where supplied power is at a premium, such as portable devices like laptop and notebook computers, personal digital assistant (PDA) devices, wireless phones, as well as other types of portable devices. As a result, designers of such devices usually choose to increase the size of the battery size contained in such devices, increasing weight and cost, or choose to reduce the running time of the devices between battery charges.

For these and other reasons, therefore, there is a need for the present invention.

SUMMARY OF THE INVENTION

An electronic device of one embodiment of the invention at least partially displays a pixel of a display image. The device includes a first reflector and a second reflector defining an optical cavity therebetween that is selective of a visible wavelength at an intensity. The device includes a mechanism to allow optical properties of the cavity to be varied such that the visible wavelength and/or the intensity are variably selectable in correspondence with the pixel of the displayable image. The device also includes one or more transparent deposited films, one or more absorbing layers, an integral micro-lens, and/or one or more anti-stiction bumps. The deposited films are over one of the reflectors, for self-packaging of the electronic device. The absorbing layers are over one of the reflectors, to reduce undesired reflections. The integral micro-lens is over one of the reflectors, and the anti-stiction bumps are between the reflectors.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Overview

Figure 1A:
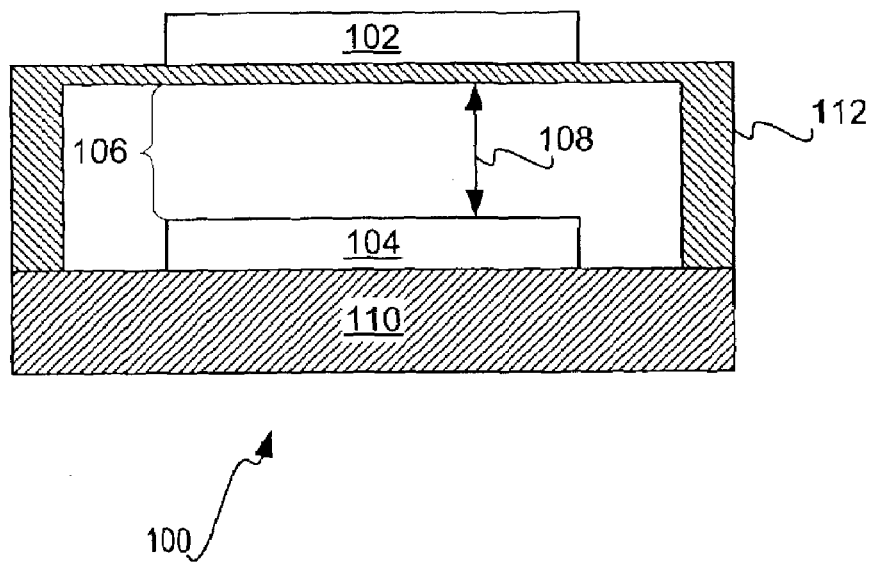
FIG. 1A is a diagram of an electronic device for at least partially displaying a pixel of a displayable image, according to an embodiment of the invention.

FIG. 1A shows an electronic device 100 for at least partially displaying a pixel of a displayable image, according to an embodiment of the invention. The device 100 includes a top reflector 102 and a bottom reflector 104, as well as a flexure 110 and a spring mechanism 112. A resonant optical cavity 106 is defined by the reflectors 102 and 104, which has a variable thickness, or width, 108. The top reflector 102 is in one embodiment highly reflective, such as completely reflective. The bottom reflector 104 is in one embodiment semi-transparent; that is, the bottom reflector 104 is in one embodiment semi-reflective. The spring mechanism 112 may be a flexible material, such as a polymer, in one embodiment of the invention, that has linear or non-linear spring functionality.

The optical cavity 106 is variably selective of a visible wavelength at an intensity, by optical interference. Depending on the desired configuration of the electronic device 100, the optical cavity 106 may either reflect or transmit the wavelength at the intensity. That is, the cavity 106 may be reflective or transmissive in nature. No light is generated by the optical cavity 106, such that the device 100 relies on ambient light or light provided by the device 100 that is reflected or transmitted by the cavity 106. The visible wavelength selected by the optical cavity 106, and its intensity selected by the optical cavity 106, are dependent on the thickness 108 of the cavity 106. That is, the optical cavity 106 can be tuned to a desired wavelength at a desired intensity by controlling its thickness 108.

The flexure 110 and the spring mechanism 112 allow the thickness 108 of the cavity 106 to vary, by allowing the bottom reflector 104 to move. More generally, the flexure 110 and the spring mechanism 112 constitute a mechanism that allows variation of the optical properties of the optical cavity 106 to variably select a visible wavelength at an intensity. The optical properties include the optical index of the cavity 106, and/or the optical thickness of the cavity 106. A voltage applied between the reflectors 102 and 104, or electrical charge stored on the reflectors 102 and 104, causes the thickness 108 of the cavity 106 to change, because the flexure 110 and the spring mechanism 112 allow the reflector 104 to move. Thus, the flexure 110 has a stiffness, and the spring mechanism 112 has a spring restoring force, such that the voltage applied to the reflectors 102 and 104 or the charge stored on the reflectors 102 and 104 causes the flexure 110 and the spring mechanism 112 to yield and allow the reflector 104 to move, achieving the desired thickness 108. No power is dissipated in maintaining a given thickness 108.

In one embodiment, the bottom reflector 104 is maintained at a fixed voltage, and the top reflector 102 is set to a voltage depending on the desired visible wavelength and the desired intensity, as calibrated to the stiffness of the flexure 110. Whereas the flexure 110 is shown in the embodiment of FIG. 1A as positioned under the bottom reflector 104, in another embodiment it may be positioned over the bottom reflector 104. In other embodiments, the flexure 110 may be positioned over or under the top reflector 102 as well, such that the bottom reflector 104 is movable, instead of the top reflector 102, to adjust the thickness 108 of the optical cavity 106. Furthermore, in another embodiment, there may be more than one optical cavity, such that the optical cavity 106 is inclusive of more than one such cavity.

In one embodiment, the bottom reflector 104 and the top reflector 102 can be considered the plates of a capacitor, where the optical cavity 106 represents the dielectric therebetween. A potential applied between the bottom reflector 104 and the top reflector 102 moves the bottom reflector 104, due to the flexure 110 and the spring mechanism 112, but also causes a charge to be stored in the capacitor. It is this electrostatic charge that then allows maintenance of the given thickness 108 without any further voltage application over the bottom reflector 104 and the top reflector 102.

The wavelength and the intensity selected by the optical cavity 106 correspond to a pixel of a displayable image. Thus, the electronic device 100 at least partially displays the pixel of the image. The electronic device 100 can operate in either an analog or a digital manner. As an analog device, the electronic device 100 selects a visible wavelength of light and an intensity corresponding to the color and the intensity of the color of the pixel. In an alternative embodiment, the electronic device 100 may be used to display the pixel in an analog manner in black-and-white, or in gray scale, in lieu of color.

As a digital device, the electronic device 100 is responsible for either the red, green, or blue color component of the pixel. The device 100 maintains a static visible wavelength, either red, green, or blue, and varies the intensity of this wavelength corresponding to the red, green, or blue color component of the pixel. Therefore, three of the device 100 are needed to display the pixel digitally, where one device 100 selects a red wavelength, another device 100 selects a green wavelength, and a third device 100 selects a blue wavelength. More generally, there is a device 100 for each color component of the pixel, or portion, of the image. Furthermore, in an alternative embodiment, the electronic device 100 may be used to display the pixel in a digital manner in black-and-white, or in gray scale, in lieu of color.

Optical Interference to Variably Select Wavelength and Intensity

The optical cavity 106 of the electronic device 100 utilizes optical interference to transmissively or reflectively select a wavelength at an intensity. The optical cavity 106 in one embodiment is a thin film having a light path length equal to the thickness 108. Light is reflected from the boundaries of the reflectors 102 and 104 on either side of the cavity 106, interfering with itself. The phase difference between the incoming beam and its reflected image is k(2d), where d is the thickness 108, because the reflected beam travels the distance 2d within the cavity 106. Since $$k = \frac{2\pi}{\lambda},$$

then when $$d = \frac{\lambda}{2},$$

the phase difference between the incoming and the reflected waves is k2d=2π, giving constructive interference. All multiples of $$\frac{\pi}{2},$$

which are the modes of the optical cavity 106, are transmitted. As a result of optical interference, then, the optical cavity 106 passes the most light at integer multiples of $$\frac{\lambda}{2},$$

and the least amount of light at odd integer multiples of $$\frac{\lambda}{4}.$$

Although the above calculations capture the primary mechanism for interference-based light modulation, more rigorous electromagnetic simulations may be desired to more accurately describe actual device performance.

In one embodiment, the top reflector 102 includes a thin, partially transmitting metallic film, where n−ik=2.5−2.5i titanium, where n represents the real optical index of the cavity 106, and k represents the imaginary optical index of the cavity 106. In this embodiment, both absorption and interference play roles in modulating the color and intensity of the output. The optical cavity 106 is an adjustable spacer, and the bottom reflector 104 is a high-reflectance metallic substrate, like aluminum. In one embodiment, where the device 100 is digital, the optical cavity 106 may select a red wavelength of 6100 angstrom (Å), a green wavelength of 5500 Å, or a blue wavelength of 4500 Å, at an intensity depending on the corresponding color component of the pixel to be displayed. Furthermore, the optical cavity 106 can achieve low reflection or transmission. In this latter state, the optical cavity 106 is a so-called "dark mirror" that can be optimized for less than five percent reflection or transmission.

For example, in this embodiment, the film stack sequence of the bottom reflector 104, the optical cavity 106, and the top reflector 102 can achieve a red wavelength of 6100 Å, with an incident n of 1.5 at the bottom reflector 104 and a substrate n of 1.52 at the top reflector 102 in accordance with the following table:

| Layers | Real index (n) | Imaginary index (k) | Thickness (Å) | Target wavelength intensity | Number of waves at target |
|---|---|---|---|---|---|
| Bottom reflector 104 (silver) | 0.2 | 5 | 6250 | 5000 | 0.25 |
| Optical cavity 106 | 1 | 0 | 2750 | 5000 | 0.55 |
| Top reflector 102 (titanium) | 2.5 | 2.5 | 200 | 5000 | 0.1 |

Similarly, this film stack sequence can achieve a green wavelength of 5500 Å with an incident n of 1.5 at the top reflector 102 and a substrate n of 1.52 at the bottom reflector 104 in accordance with the following table:

| Layers | Real index (n) | Imaginary index (k) | Thickness (Å) | Target wavelength intensity | Number of waves at target |
|---|---|---|---|---|---|
| Bottom reflector 104 (silver) | 0.2 | 5 | 6250 | 5000 | 0.25 |
| Optical cavity 106 | 1 | 0 | 2500 | 5000 | 0.5 |
| Top reflector 102 (titanium) | 2.5 | 2.5 | 200 | 5000 | 0.1 |

The film stack sequence can also achieve a blue wavelength of 4500 Å with an incident n of 1.5 at the top reflector 102 and a substrate n of 1.52 at the bottom reflector 104 in accordance with the following table:

| Layers | Real index (n) | Imaginary index (k) | Thickness (Å) | Target wavelength intensity | Number of waves at target |
|---|---|---|---|---|---|
| Bottom reflector 104 (silver) | 0.2 | 5 | 6250 | 5000 | 0.25 |
| Optical cavity 106 | 1 | 0 | 2000 | 5000 | 0.5 |
| Top reflector 102 (titanium) | 2.5 | 2.5 | 200 | 5000 | 0.1 |

Thus, the film stack sequence achieves a red wavelength of 6100 Å, a green wavelength of 5500 Å, or a blue wavelength of 4500 Å, depending on whether the thickness of the optical cavity 106 is 2750 Å, 2500 Å, or 2000 Å, respectively.

Finally, the film stack sequence can achieve a low reflection or a low transmission with an incident n of 1.5 at the top reflector 102 and a substrate n of 1.52 at the bottom reflector 104 in accordance with the following table:

| Layers | Real index (n) | Imaginary index (k) | Thickness (Å) | Target wavelength intensity | Number of waves at target |
|---|---|---|---|---|---|
| Bottom reflector 104 (silver) | 0.2 | 5 | 6250 | 5000 | 0.25 |
| Optical cavity 106 | 1 | 0 | 400 | 5000 | 0.08 |
| Top reflector 102 (titanium) | 2.5 | 2.5 | 200 | 5000 | 0.1 |

This results in dark gray, nearly black output, where the thickness of the optical cavity 106 is 400 Å. By ratioing the amount of time that a pixel remains in the colored or black states, a large range of average hues and intensities can be obtained.

Controlling Thickness of Optical Cavity

As has been indicated, the flexure 110 and the spring mechanism 112 allow the thickness 108 of the optical cavity 106 to vary when an appropriate voltage has been applied across the reflectors 102 and 104, such that a desired wavelength at a desired intensity is selected. This voltage is determined in accordance with the following equation, which is the force of attraction between the reflectors 102 and 104 acting as plates of a parallel plate capacitor, and which does not take into account fringing fields:

$$F = \frac{\varepsilon_0 V^2 A}{2d^2}, \tag{1}$$

where $\varepsilon_0$ so is the permittivity of free space, V is the voltage across the reflectors 102 and 104, A is the area of each of the reflectors 102 and 104, and d is the thickness 108. Thus, a one volt potential applied across a 100 micron square pixel, with a thickness 108 of 0.25 micron, yields an electrostatic force of $7 \times 10^{-7}$ Newton (N).

Therefore, a small voltage between the reflectors 102 and 104 provides sufficient force to move the bottom reflector 104, and hold it against gravity and shocks. Once the voltage has been applied, the electrostatic charge stored in the capacitor created by the reflectors 102 and 104, and defining the cavity 106, is sufficient to hold the bottom reflector 104 in place without additional power. Charge leakage may require occasional refreshing of the charge, however.

The force defined in equation (1) is balanced with the linear spring force provided by the spring mechanism 112:

$$F = k(d_0 - d), \quad (2)$$

where k is the linear spring constant, and $d_0$ is the initial value of the thickness 108. The range in which the forces of equations (1) and (2) are in stable equilibrium occurs when the value $(d_0 - d)$ is between zero and $$\frac{d_0}{3}.$$

At $$d_0 - d > \frac{d_0}{3},$$

the electrostatic force of attraction of equation (1) overcomes the spring force of equation (2), such that the reflector 104 snaps to the reflector 102, which is undesirable. This occurs because when the reflector 104 is beyond the $$\frac{d_0}{3}$$

position, excess charge is drawn onto the reflectors 102 and 104 due to increased capacitance, which in turn increases the attractive force of equation (1) between the reflectors 102 and 104, causing the reflector 104 to pull towards the reflector 102.

To overcome this limitation, the force between the reflectors 102 and 104 of equation (1) can instead be written as a function of charge:

$$F = \frac{-Q^2}{2\varepsilon A}, \quad (3)$$

where Q is the charge on the capacitor. Thus, the force F is now not a function of the distance d, and stability of the reflector 104 can exist over the entire range of 0 to $d_0$. By limiting the amount of charge on the reflectors 102 and 104, in other words, the position of the reflector 104 can be set over the entire range of travel.

Although the description of the preceding paragraphs is with respect to an ideal parallel-plate capacitor and an ideal linear spring restoring force, those of ordinary skill within the art can appreciate that the principle described can be adapted to other configurations, such as non-linear springs and other types of capacitors. Eliminating or reducing the range of operation where snap down of the reflector 104 against the reflector 102 occurs enables more practical analog operation, or non-contact discrete operation, without limiting the number of colors as may otherwise occur when snap down occurs. That is, because the usable range is increased, more colors, saturation levels, and intensities can be achieved.

In addition, in one embodiment, the range within which non-contact operation can occur without snap down may be increased by constructing the flexure 110 in a particular manner. The particular manner is such that the restoring force of the spring mechanism 112 is a non-linear function of the displacement of the flexure 110, and increases at a faster rate than the displacement. This can be achieved by increasing the thickness of the flexure 110, or by using a flexure that is first bent and then stretched, which is known as a "bend and stretch" design.

Furthermore, the device 100 can be operated at smaller values of the thickness 108, allowing a black state to be achieved without any portion of the reflectors 102 and 104 coming into contact with one another. This prevents stiction and the accompanying hysteresis that occurs when the reflectors 102 and 104 contact one another. Even if the reflectors 102 and 104 are allowed to contact one another, the voltage difference between the reflectors 102 and 104 will be less where the amount of charge on the reflectors 102 and 104 is specifically controlled (that is, where a predetermined amount of fixed charge is controlled), as opposed to where the voltage between the reflectors 102 and 104 is specifically controlled. This advantageously reduces electrostatic breakdown in the dielectric separating the reflectors 102 and 104 that defines the optical cavity 106, as well as reducing the electrostatic force between the reflectors 102 and 104 that would otherwise increase stiction, and the wear on any anti-stiction standoffs employed to reduce the surface area between the reflectors 102 and 104.

Controlling Charge on Reflectors

Figure 1B:
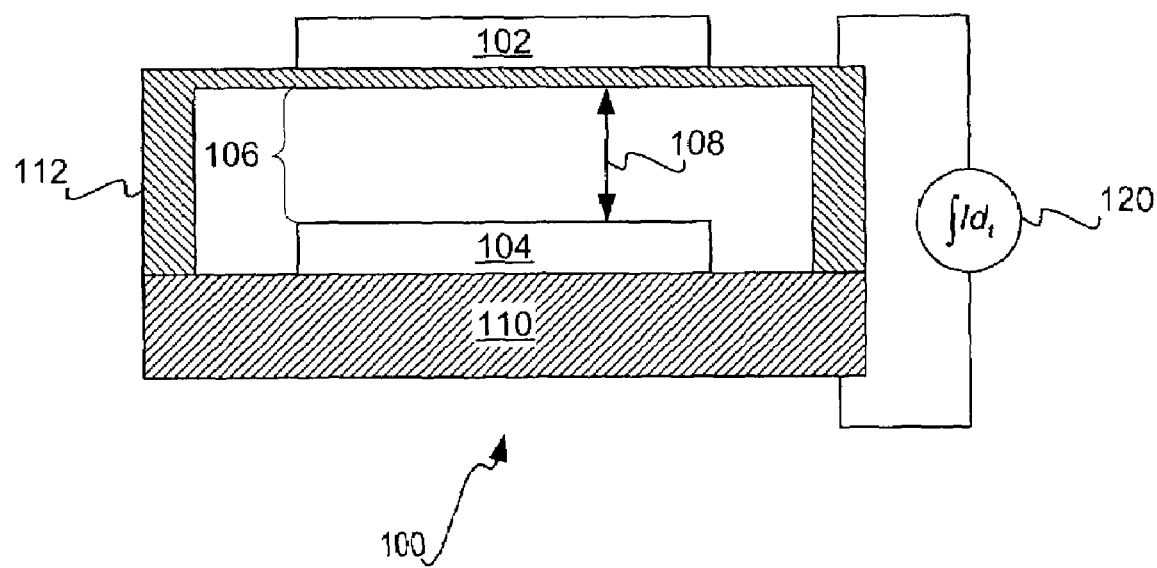
FIGS. 1B, 1C, and 1D are diagrams showing different approaches to control the charge stored on the electronic device of FIG. 1A, according to varying embodiments of the invention.
Figure 1C:
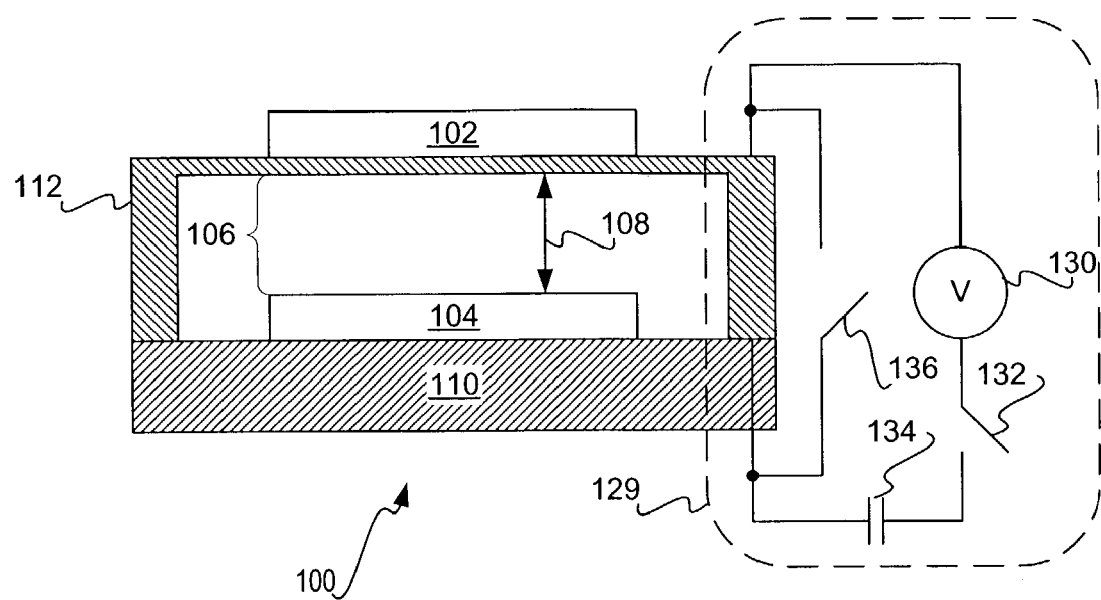
Figure 1D:
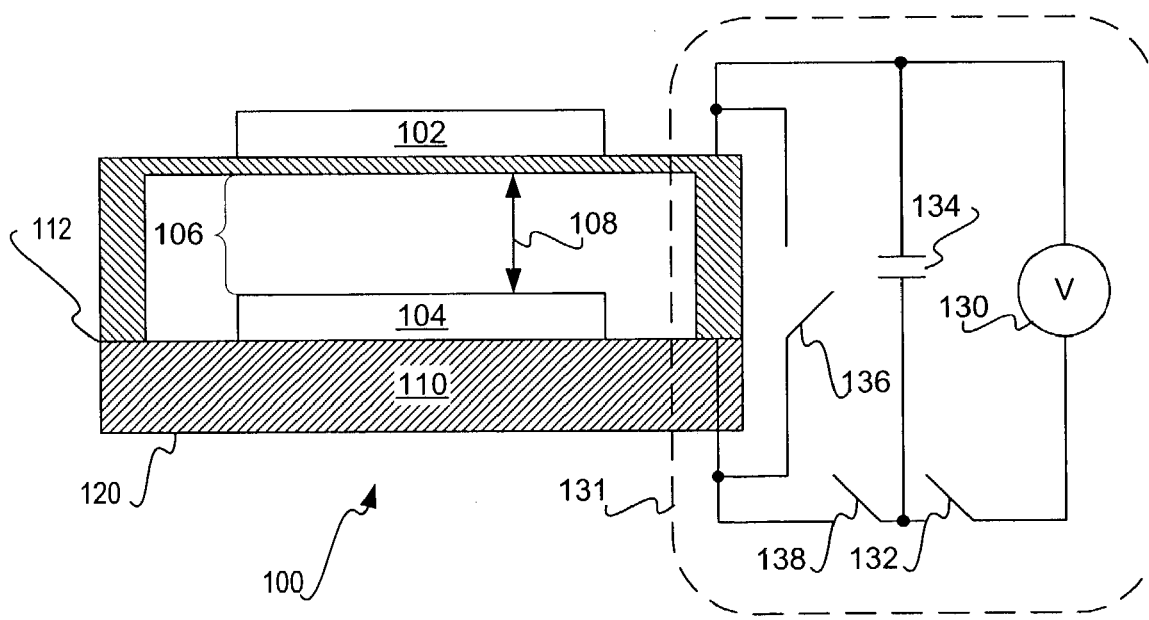

FIGS. 1B, 1C, and 1D show different approaches to control the amount of charge on the reflectors 102 and 104 of the electronic device 100, as opposed to specifically controlling the voltage between the reflectors 102, and 104, according to varying embodiments of the invention. As has been described in the preceding section of the detailed description, the thickness 108 between the reflectors 102 and 104 can be regulated by controlling the charge stored on the reflectors 102 and 104. The reflectors 102 and 104 thus act as the plates of a parallel plate capacitor.

In FIG. 1B, a controlled, or predetermined, amount of charge is injected onto the reflectors 102 and 104 by integrating a known current for a known time, utilizing the current integration mechanism 120 electrically coupled to the reflectors 102 and 104. The current, I, the time, t, or both the current and the time can thus be manipulated to yield the desired amount of charge. The mechanism 120 may include a current source, a digital-to-analog current source, and/or time division circuitry to create the desired level of charge.

In FIG. 1C, the charge available to the reflectors 102 and 104 is limited to prevent snap down of the reflectors 102 and 104 together. This is specifically accomplished in one embodiment of the invention by utilizing a voltage divider circuit 129. The circuit 129 includes a voltage source 130 placed in series with a capacitor 134. A switch 132 controls the on-off operation of the circuit 129. A switch 136, placed in parallel with the voltage source 130 and the capacitor 134, acts as a reset switch, which may be utilized to avoid voltage or charge drift over time, due to charge leakage. The reset is desirably performed more quickly than the mechanical response time of the circuit 129.

Where the flexure 110 is linear, the range of stable travel can be extended through the entire initial thickness 108 of the optical cavity 106 if $$C < \frac{C'_{init}}{2},$$

where C is the capacitance of the capacitor 134, and $C'_{init}$ is the initial capacitance of the variable capacitor formed by the reflectors 102 and 104, and the optical cavity 106. As the voltage of the voltage source 130 increases, the resulting charge is shared between the variable capacitor and the capacitor 134 to at least substantially eliminate snap down. As can be appreciated by those of ordinary skill within the art, this principle can be applied to other configurations than a parallel plate capacitor and a linear spring restoring force, such as non-linear springs, and capacitors other than parallel plate capacitors.

In FIG. 1D, the charge on the reflectors 102 and 104 is controlled by using an approach referred to as fill-and-spill, utilizing a fill-and-spill circuit 131. The switch 136 is closed and opened to discharge the variable capacitor formed by the reflectors 102 and 104, and the optical cavity 106. The switch 138 of the circuit 131 is then opened and the switch 132 is closed, to charge the fixed capacitor 134. That is, the capacitor 134 is "filled." Next, the switch 132 is opened and the switch 138 is closed, so that the capacitor 134 shares its charge with the variable capacitor. That is, the capacitor 134 "spills" its charge. The charge on the reflectors 102 and 104 reaches a stable value, even though it depends on the thickness 108 of the optical cavity 106. The voltage source 130 has thus provided a controlled charge to maintain the desired thickness 108.

Higher-order Gaps

The optical interference as described in the preceding sections of the detailed description to transmissively or reflectively select wavelengths at desired intensities relies upon first-order gaps in one embodiment of the invention. That is, the gap of the optical cavity 106, which is the thickness 108 of the optical cavity 106, is regulated so as to control the interference first-order wavelengths of light. However, as the thickness 108 of the optical cavity 106 increases, reflectance peaks shift to longer wavelengths, and additional, higher order, peaks move into the spectral region.

The spectral bandwidth of the electronic device 100 is determined by the optical constants of the films utilized for the reflectors 102 and 104, their thicknesses, and the thickness 108 of the optical cavity 106 between the reflectors 102 and 104. In such instances, the electronic device 100 functions as a so-called Fabry-Perot-based light modulator. The spectral purity, or saturation, of the reflected light is determined by the spectral bandwidth of the device 100, and tradeoffs may have to be made between peak reflectance, spectral bandwidth, black state reflectance, and optical efficiency of the white state.

Peak reflectance occurs for reflective Fabry-Perot modulators when:

$$2nd = m\lambda, \quad (4)$$

where, as before, n is the gap index, d is the thickness 108 of the optical cavity 106, m is a non-negative integer specifying the interference order, and $\lambda$ is the wavelength of light. Equation (4) thus specifies a simple model of interference. It is noted that the actual reflectance spectra may be more accurately modeled by performing rigorous electromagnetic simulations, involving all material constants and interfaces within the device 100, as can be appreciated by those of ordinary skill within the art of optical thin films.

The higher-order peaks exhibit a narrower spectral bandwidth and thus increased saturation. The spectral bandwidth of the green state is particularly significant in determining saturation, since the wavelengths in and around the green wavelengths overlap the blue and red sensitivity curves of the human eye. The red and blue saturation may be improved by shifting the peak spectral wavelength away from the adjacent color-response curves and into the relatively insensitive portion of the spectrum, which is not possible with green. Narrowing the spectral bandwidth to increase the green saturation therefore has the problem of limiting the brightness of the display, since the peak sensitivity of the human eye is in the green region, leading to a reduced white level and lower overall contrast.

Figure 2A:
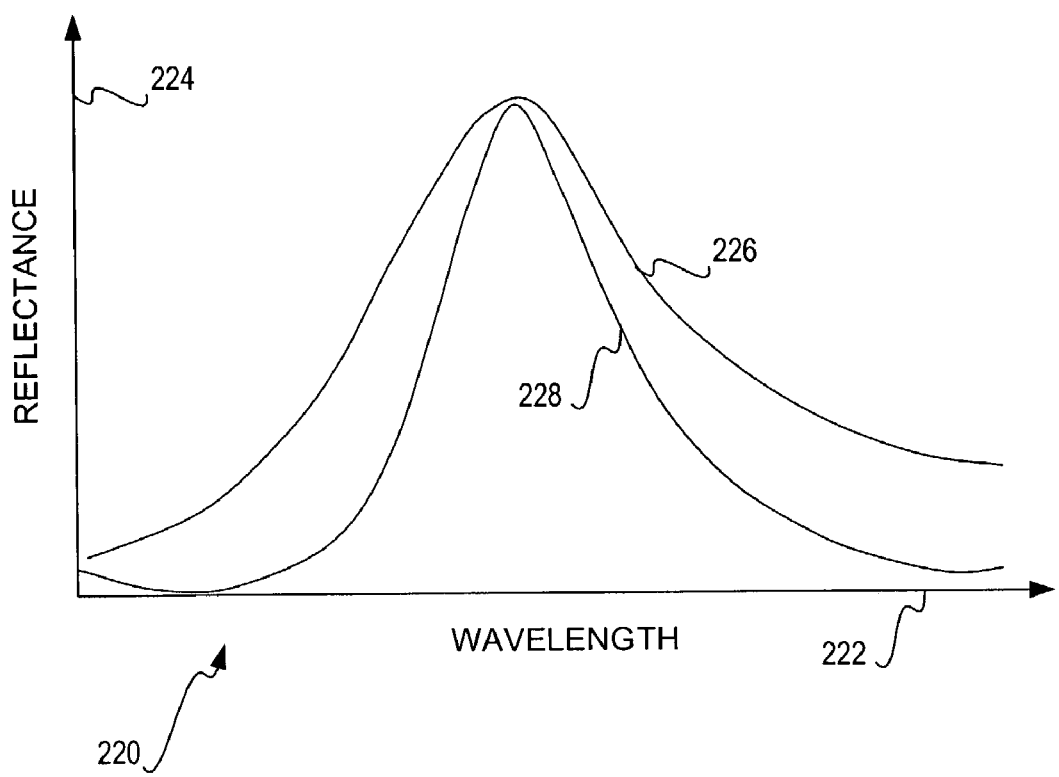
FIGS. 2A and 2B are graphs of representative spectral responses of the electronic device of FIG. 1A, according to varying embodiments of the invention.

To overcome this limitation, the thickness 108 may be increased to produce second-order, or more generally higher-order, color, rather than first-order color. FIG. 2A shows a graph 220 of a representative first-order green spectral response 226 and a representative green second-order spectral response 228, according to an embodiment of the invention. The y-axis 224 denotes reflectance as a function of wavelength on the x-axis 222. The second-order response 228 has a narrower spectral bandwidth and improved color saturation. Thus, the second-order response 228 can be utilized in one embodiment of the invention in lieu of the first-order response 226 for increased saturation and color component. In another embodiment, the second-order response 228 is utilized for increased saturation, whereas the first-order response 226 is utilized for increased brightness and white level.

Figure 2B:
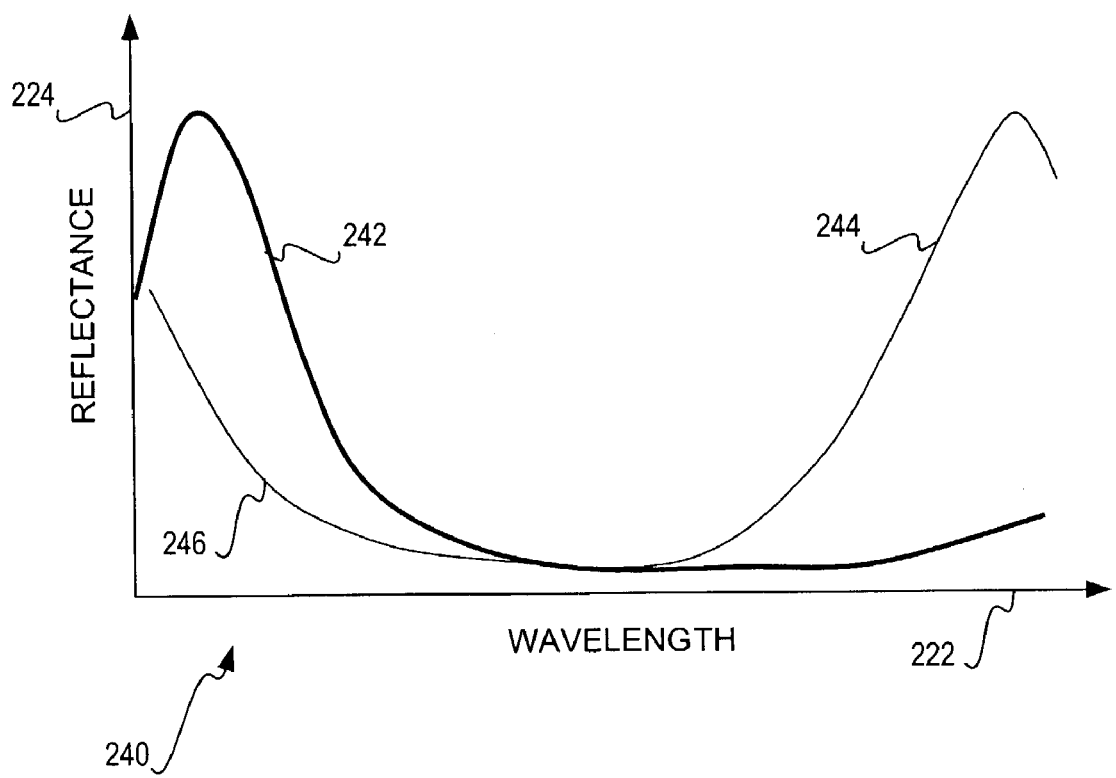

Color saturation is typically improved for second-order responses for blue through green. FIG. 2B shows a graph 240 of a second-order blue spectral response 242, according to an embodiment of the invention. The graph 240 has the y-axis 224 denoting reflectance as a function of wavelength on the x-axis 222, as before. The second-order blue response 242 provides for increased saturation, as compared to using a first-order blue spectral response. However, the second-order red spectral response 244 is less useful, because the third-order blue spectral response 246 begins to enter the visible spectral range.

Display Device and Method of use Thereof

Figure 3A:
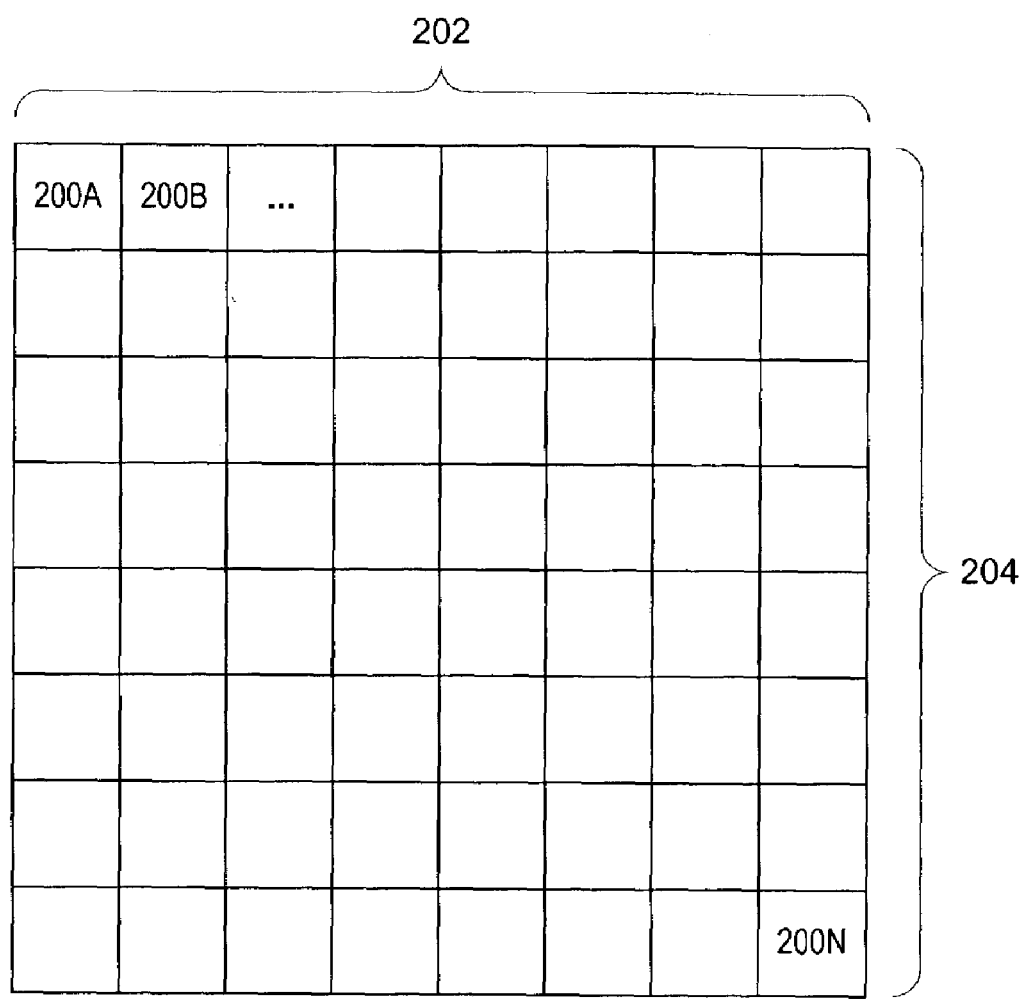
FIG. 3A is a diagram of an array of passive pixel mechanisms, according to an embodiment of the invention.

FIG. 3A shows an array of passive pixel mechanisms 200, according to an embodiment of the invention. The passive pixel mechanisms 200 include the mechanisms 200A, 200B, . . . , 200N, organized into columns 202 and rows 204. Each of the pixel mechanisms 200 is able to variably select a visible wavelength at an intensity by optical interference and absorption, in correspondence with a displayable image. The pixel mechanisms 200 can be considered the apparatus for performing this functionality in one embodiment of the invention. The mechanisms 200 are passive in that they do not generate light by themselves, but rather reflect or transmit ambient and/or supplemental light.

In one embodiment, each of the passive pixel mechanisms 200 includes one or more of the electronic device 100. Thus, a pixel may include one or more of the device 100. Where the passive pixel mechanisms 200 display their corresponding pixels of the displayable image in an analog manner, each of the mechanisms 200 may include only one electronic device 100, because the single device 100 is able to display substantially any color at any intensity. Where the mechanisms 200 display their corresponding pixels in a digital manner, each of the mechanisms 200 may include three of the electronic devices 100, one for each of the red color component, the green color component, and the blue color component.

Figure 3B:
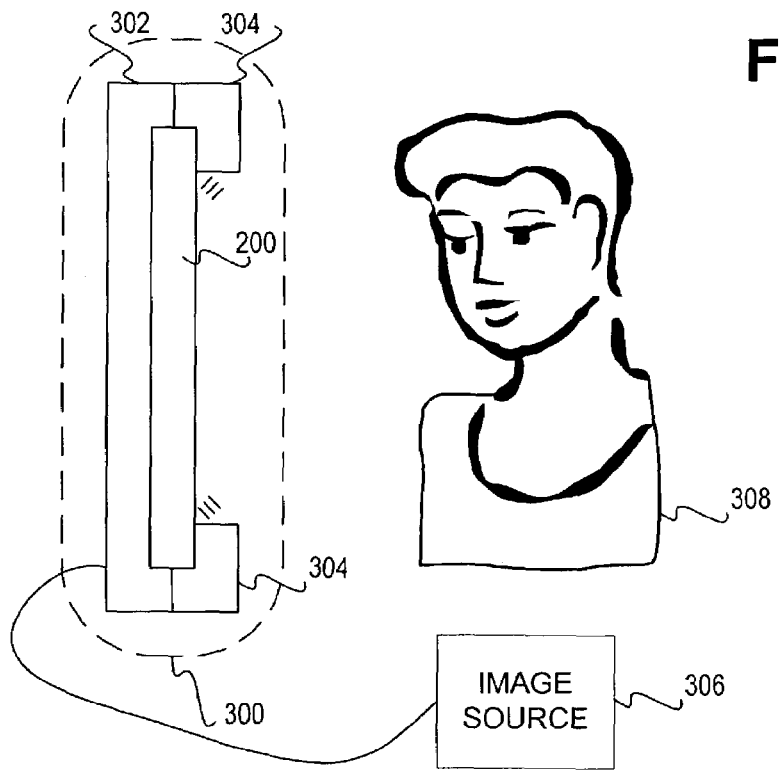
FIG. 3B is a cross-sectional diagram of a display device, according to an embodiment of the invention.

FIG. 3B shows a cross-sectional profile of a display device 300, according to an embodiment of the invention, which incorporates the array of passive pixel mechanisms 200. An optional supplemental light source 304 outputs light for reflection by the mechanisms 200. Where the light source 304 is present, the mechanisms 200 reflect both the light provided by the source 304, as well as any ambient light. Where the light source 304 is absent, the mechanisms 200 reflect ambient light. The light source 304 is indicated in the embodiment of FIG. 3B such that it outputs light for reflection by the mechanisms 200. In another embodiment, the light source 304 may be behind the mechanisms 200, such that the mechanisms 200 transmit light output by the source 304.

A controller 302 controls the pixel mechanisms 200, effectively providing a pixilated displayable image to the pixel mechanisms 200. That is, in the embodiment where the mechanisms 200 each include one or more of the electronic device 100, the controller 302 changes the thickness 108 of the cavity 106 of each device 100, so that the image is properly rendered by the pixel mechanisms 200, for display to a user 308. The controller 302 thus electrically or otherwise adjusts the thickness 108 of the optical cavity 106, where, once adjusted, the thickness 108 is maintained by the flexure 110.

The controller 302 may receive the displayable image from an image source 306 in a pixilated or a non-pixilated manner. If non-pixilated, or if pixilated in a manner that does not correspond on a one-to-one basis to the array of passive pixel mechanisms 200, the controller 302 itself divides the image into pixels corresponding to the array of passive pixel mechanisms 200. The image source 306 itself may be external to the display device 300, as in the embodiment of FIG. 3B, or internal thereto. The image source 306 may thus be a desktop computer external to the display device 300, or may be a laptop or notebook computer, personal digital assistant (PDA) device, wireless phone, or other device of which the display device 300 is a part.

Figure 4:
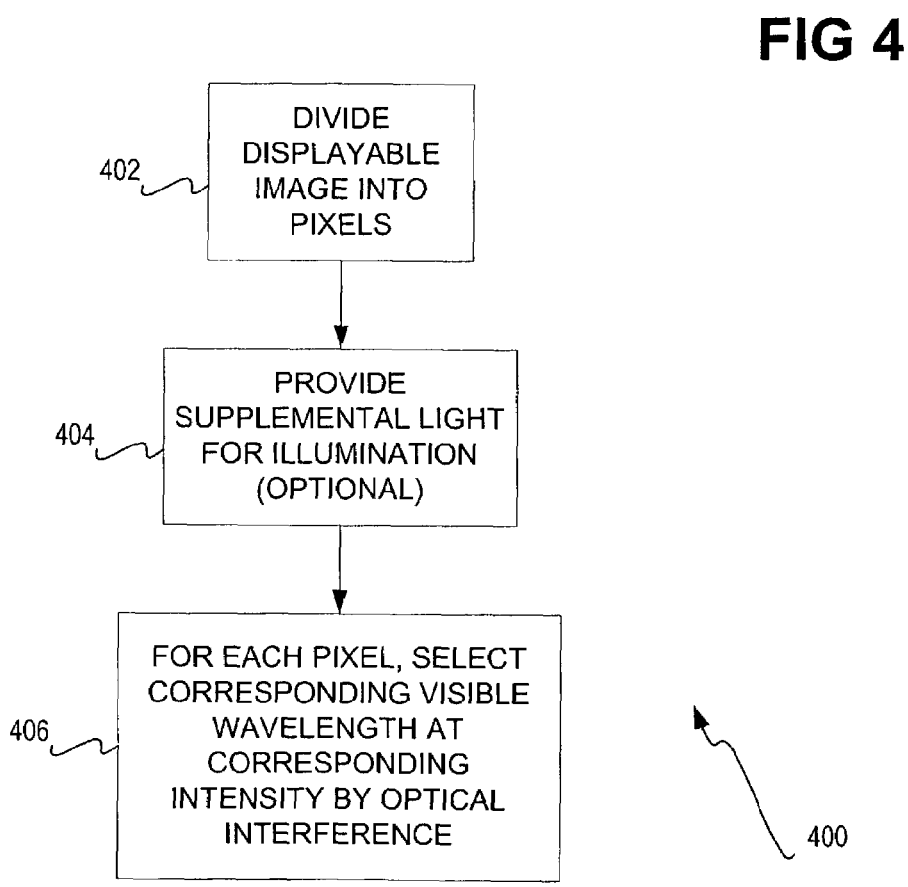
FIG. 4 is a method of use, according to an embodiment of the invention.

FIG. 4 shows a method of use 400, according to an embodiment of the invention, for a display device, such as the display device 300 of FIG. 3B. First, a displayable image is divided into pixels (402), resulting in a pixilated displayable image. Light is optionally provided (404), to supplement any ambient light. For each pixel of the image, a corresponding visible wavelength is selected, at a corresponding intensity, by optical interference and absorption (406), as has been described. The corresponding wavelength at the corresponding intensity may be selected in a digital or an analog manner, as has also been described.

Specific Electronic Device and Method of Manufacture Thereof

Figure 5:
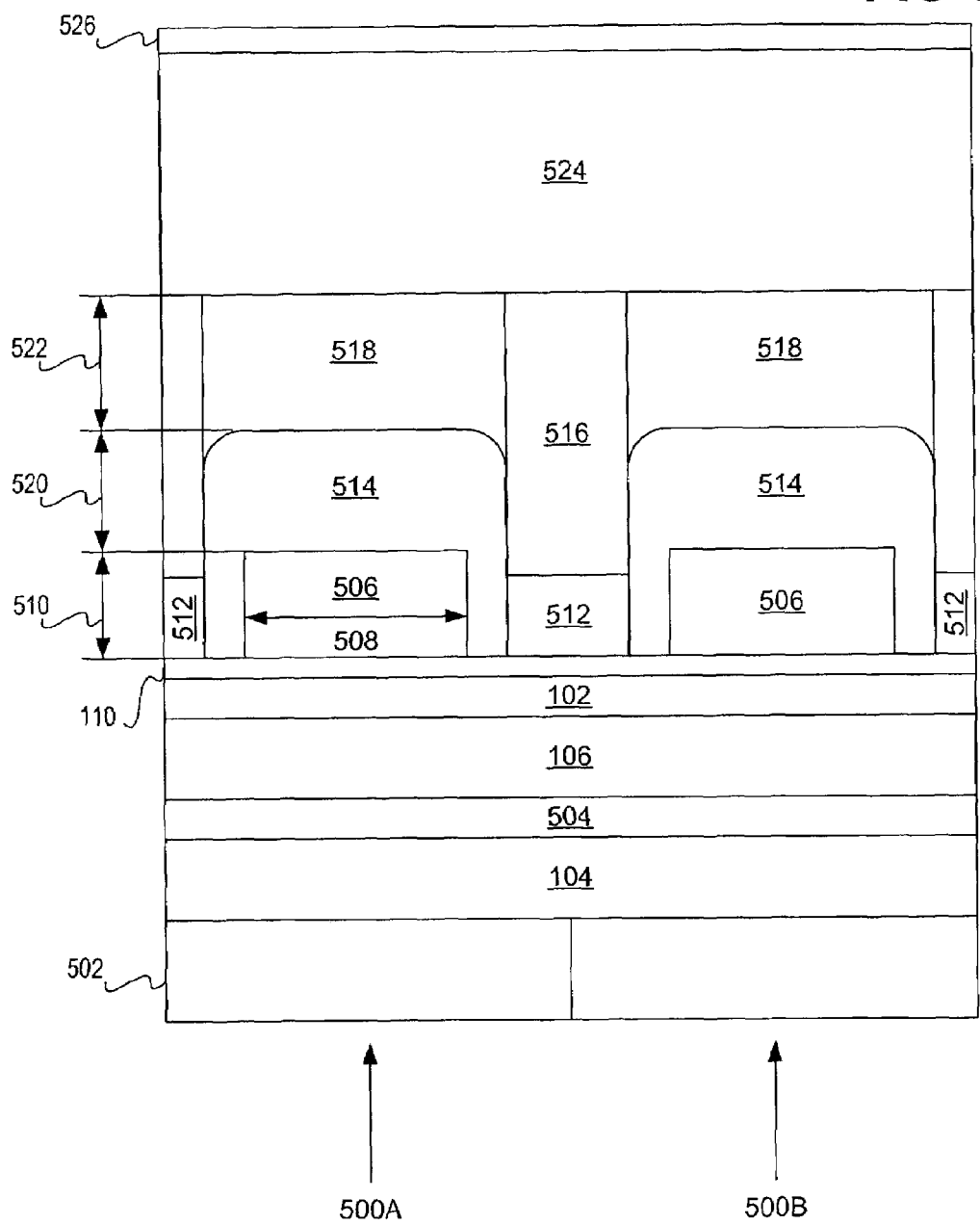
FIG. 5 is a diagram of an electronic device that is more specific than but consistent with the electronic device of FIG. 1A, according to an embodiment of the invention.

FIG. 5 shows a pair of electronic devices 500A and 500B for at least partially displaying a corresponding pair of pixels of a displayable image, according to an embodiment of the invention. Each of the electronic devices 500A and 500B is a specific embodiment of the electronic device 100 of FIG. 1A, and thus the description of FIG. 1A is equally applicable to FIG. 5 as well. Furthermore, the electronic devices 500A and 500B can each be used to realize each of the passive pixel mechanisms 200 of FIG. 3A, in one embodiment of the invention. The following description of FIG. 5 is made with specific reference to the electronic device 500A, but is identically applicable to the electronic device 500B. Furthermore, FIG. 5 is not drawn to scale, for illustrative clarity.

The bottom reflector 104 is positioned over a silicon substrate 502, and more generally is a conductive reflective layer. A thin dielectric 504 is present over the bottom reflector 104 to prevent shorting of the reflector 102. The optical cavity 106 is defined between the top reflector 102 and the bottom reflector 104, where the top reflector 102 is also more generally a conductive reflective layer. The flexure 110, positioned over the top reflector 102, is also referred to as a flexure layer, and acts as a flexible electrode for the top reflector 102, as well as maintains tension on the top reflector 102 and allows the reflector 102 to move. The spacing of the optical cavity 106 can be controlled by calibrating voltage to the stiffness of the flexure 110 in an analog mode, or by providing stops of varying thickness for red, green, and blue pixels in a digital mode.

A dielectric pixel plate 506, which may be oxide, partially covers the flexure 110 and the top reflector 102. In one embodiment, the dielectric pixel plate 506 may have a width 508 of between 40 and 100 micron, and can have a height 510 of between three and five micron. An air cavity 514 surrounds the dielectric pixel plate 506, and is larger than the coherence length of the optical cavity 106 to prevent additional interference effects. The air cavity 514 in one embodiment may have a height 520 of between three and five micron. The oxide 512 and 518 represent an additional layer used to define the air cavity 514, where in one embodiment the oxide 518 may also have a height 522 of between three and five micron.

The via hole 516 is used to allow removal of material from the air cavity 514 and the optical cavity 106. For instance, polysilicon or another filler material may be deposited to reserve space for the air cavity 514 and the optical cavity 106, but then is removed to actually form the cavities 514 and 106. A protective layer 524 covers the oxide 518, and an anti-reflective coating (ARC) 526 covers the protective layer 524. The ARC 526 is desirable to avoid unwanted coherent interactions within the optical cavity 106 itself.

Figure 6:
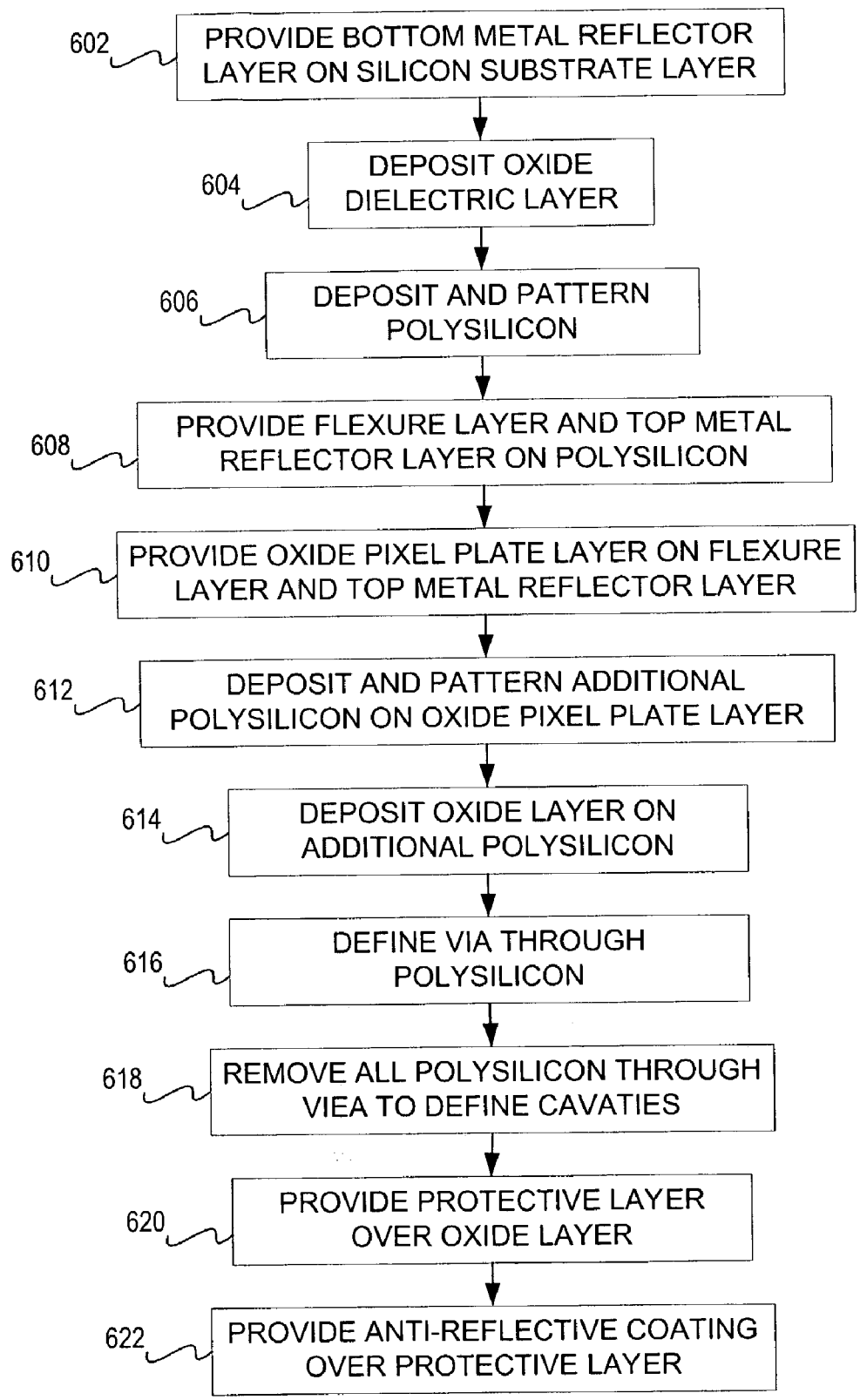
FIG. 6 is a method of manufacture, according to an embodiment of the invention.

FIG. 6 shows a method 600 for manufacturing an electronic device, such as the electronic device 500A or 500B of FIG. 5, or a display device having a number of such electronic devices, according to an embodiment of the invention. First, a bottom metal reflector layer is provided on a silicon substrate layer (602). This may include depositing and patterning the bottom metal reflector layer. In FIG. 5, the bottom metal reflector layer is the bottom reflector 104. Next, an oxide dielectric layer is deposited (604), which in FIG. 5 is the thin dielectric 504.

Polysilicon or a different filler material is deposited and patterned (604). The polysilicon acts as a placeholder for the resonant optical cavity to be formed. In FIG. 5, the polysilicon thus occupies the space of the optical cavity 106. A flexure layer and a top metal reflector layer are then provided on the polysilicon (608). This can include depositing the flexure layer first and then the top metal reflector layer, or vice-versa, and patterning the flexure layer and the top metal reflector layer. In FIG. 5, the flexure layer is the flexure 110, whereas the top metal reflector layer is the top reflector 102.

An oxide pixel plate layer is provided on the flexure layer and the top metal reflector layer (610). This can include depositing the oxide and patterning the oxide. In FIG. 5, the oxide pixel plate layer is the dielectric pixel plate 506. Additional polysilicon or additional filler material is then deposited on the oxide pixel plate layer and patterned (612), to act as a placeholder for an air cavity to be formed. In FIG.

5, the polysilicon thus occupies the space of the air cavity 514. An oxide layer is deposited on this polysilicon (614), which in FIG. 5 is the oxide 518 and 512.

Next, a via hole is defined through the polysilicon (616), which is represented in FIG. 5 as the via hole 616. The polysilicon that has been previously deposited is then removed to define the resonant optical cavity and the air cavity (618). For instance, the removal can be conducted by performing isotropic polysilicon cleanout etching. In FIG. 5, this results in formation of the optical cavity 106 and the air cavity 514. Finally, a protective layer is provided over the oxide layer (620), and an anti-reflective coating is provided over the protective layer (622). In FIG. 5, the protective layer is the protective layer 524, and the anti-reflective coating is the anti-reflective coating 526.

Additional Specific Electronic Devices

Figure 7A:
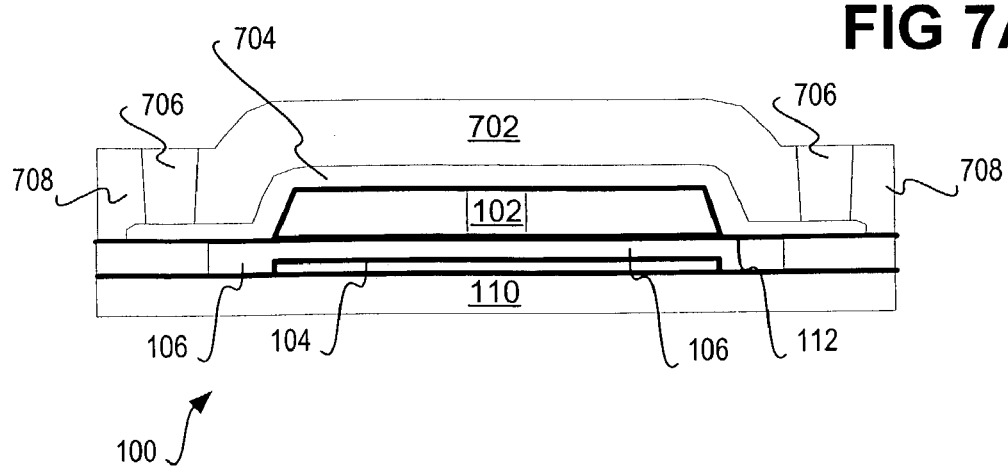
FIGS. 7A, 7B, and 7C are diagrams of electronic devices that are more specific than but consistent with the electronic device of FIG. 1A, according to varying embodiments of the invention.
Figure 7B:
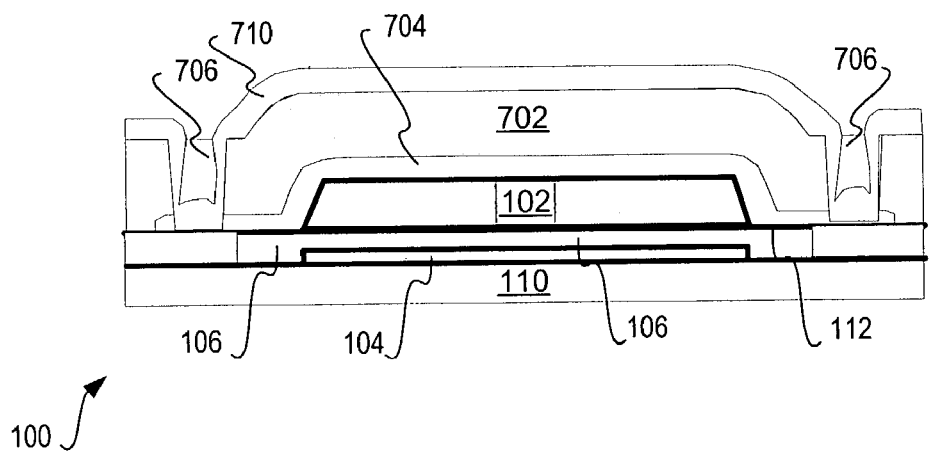

FIGS. 7A and 7B shows the electronic device 100 of FIG. 1A, according to a specific embodiment of the invention. The description of FIG. 1A is thus applicable to FIGS. 7A and 7B as well. The electronic device 100 of the embodiment of FIGS. 7A and 7B is more generally a Fabry-Perot-based device. The sawing and packaging of optical microelectrical mechanical system (MEMS) devices, such as micro-mirrors, Fabry-Perot devices, and diffraction-based devices, can be difficult because of the fragility of the MEMS components, and the need for a transparent package. MEMS are generally semiconductor chips that have a top layer of mechanical devices, such as mirrors, fluid sensors, and so on. Wafer sawing is a wet process that can damage and/or contaminate the delicate devices upon release. Releasing the devices from sacrificial layers after sawing is difficult and costly if performed on a die-by-die basis. Packaging of such devices usually includes bonding a glass window to a package on a ceramic or other substrate, which can be costly, difficult to perform, and may add considerable size to the device. The electronic device 100 of the embodiment of FIGS. 7A and 7B overcomes these problems.

Referring first to FIG. 7A, a sacrificial material 704 is deposited over the movable components of the device 100, including the flexure 110, the reflective layers 102 and 104 that define the optical cavity 106, and the spring mechanism 112 that have been described. A layer 702 is deposited over and makes contact with this substrate at the locations indicated by the reference number 708. Openings 706 are patterned and etched in the layer 702. The device 100 is released by isotropically etching away the sacrificial material 704, using selective release chemistries known within the art, which may be dry or wet processes.

Referring next to FIG. 7B, a material 710 is then deposited into the openings, or vias, 706, to provide a sealed environment for the device 100. The layer 702 and the material 710 can be transparent dielectrics, or multi-layer films. The material 710 can perform a dual role as both an anti-reflective coating, and a sealing layer. Where techniques such as physical vapor deposition (PVD) or chemical vapor deposition (CVD) are utilized, a vacuum or hermetic environment can be achieved. Utilizing CVD at higher pressures can be employed where a higher-pressure environment is utilized.

The material 710 is optional, however, if a hermetic seal is not desired. Even without the material 710, some protection for the device 100 is achieved, as non-hermetic seals also help to protect the device 100 from water, contaminants, and particulates. If the material 710 is used to seal the openings 706, but is not desired over the entire surface, it may be patterned and etched away using lithographic techniques known within the art.

Furthermore, the process described in relation to FIGS. 7A and 7B enables encapsulation within a clean-room environment without conventional packaging, such that the process may be described as self-packaging. Because the process is preferably performed in a clean-room environment, and the release operation occurs inside a protective cavity, increased yields can result. Once the cavities are sealed, the die can be sawed off, as known within the art, without damaging the device 100.

Figure 7C:
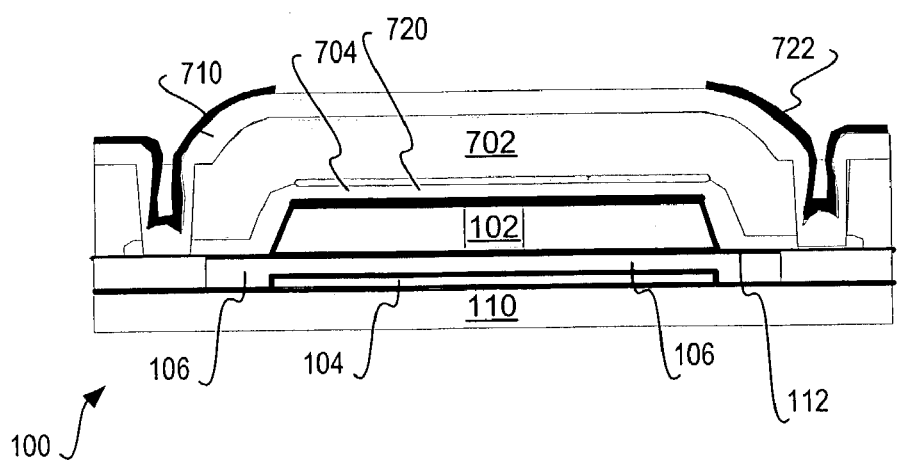

FIG. 7C shows the electronic device 100 of FIG. 1A, according to another specific embodiment of the invention. The description of FIG. 1A is thus applicable to FIG. 7C as well. It is noted that the ratio of the active light modulator area to the non-active area is referred to as the aperture ratio. The non-active area includes the space between pixels, support posts, the flexure area, and so on. Light reflected from the non-active area can increase the black state reflectance, reducing overall system contrast. The electronic device 100 of the embodiment of FIG. 7C reduces this effect by including an absorbing layer, or border mask, 722 to cover such non-active areas. The self-packaging material 710 that has been described in conjunction with FIG. 7B provides a substrate for the border mask 722. Other like-numbered components of FIG. 7C relative to FIGS. 7A and 7B are identical to their counterparts of FIGS. 7A and 7B, and are not re-described in relation to FIG. 7C.

The border mask 722 may be composed of a variety of different materials, including absorptive polymers, photo-imageable absorptive polymers, metal and/or dielectric composites, and/or interference-based induced absorbers. Absorptive polymers are typically spun on and imaged with a photoresist mask and develop process. Photo-imageable polymers can be patterned directly with lithographic techniques known within the art. Metal and/or dielectric composites known as cermets are other materials that can be used, and have typically been developed for use as solar absorbers. Such materials include black molybdenum, black tungsten, and black chrome, and have very high absorbance. Further, they can be deposited with sputtering or evaporation techniques known within the art. Induced absorbers maximize the absorbance within a dissipating layer, by tuning layer thickness. Induced absorbers are relatively thin, such as less than 1000 Å.

The electronic device 100 of the embodiment of FIG. 7C lends itself to a three-state operation having dedicated pixel types. For instance, there may be a type-one three-state pixel, having the color states red, green, and black, or there may be a type-two three-state pixel, having the color states red, blue, and black. There may also be a type-three three-state pixel, having the color states green, blue, and black. Thus, the configuration of this operation includes groups of three-state pixels. Different pixels in the group are designed to operate with different states. The different color states are controlled by the thickness of the sacrificial material 704. Such a configuration can be operated in a digital mode, with one pixel plate, or reflector, state in a non-contact position, and the other two states in contact with either the top or bottom capacitor plates, or reflectors. This has the advantage over a single-gap, two-state, configuration by allowing a color to be produced by two of the three pixels, instead of one of the three pixels, leading to brighter colors.

The electronic device 100 of the embodiment of FIG. 7C also lends itself a dual-gap, dual-capacitor pixel design, which is characterized by the reflector 102 moving forming two variable capacitors, as is now described. A layer 720 is a partial reflector on the underside of the layer 702, and is over the reflector 102. The layer 720 acts as both a partial reflector and as a capacitor plate. The reflector 102 may be driven up towards the layer 720, or down towards reflector, or capacitor plate, 104 electrostatically. The spring mechanism 112 thus is deflected in two directions, and needs to travel only about half as far from its equilibrium position to cover the same total travel as when deflected in just one direction. This increased travel range enables modes of operation where pixels can produce multiple colors, multiple saturations, and black. The cavity made by removing the sacrificial material 106 serves as one gap, and the optical cavity 704 serves as another gap in this design.

Such a design can function in at least two different modes of operation. For example, in one mode of operation, individual pixels are capable of creating multiple colors and intensities as needed for color displays. The pixels operate in contact mode at one or both of the gap extremes, and otherwise operate in on-contact mode. As another example, in another mode of operation, multiple hues and intensities can be achieved without operating in contact mode.

Furthermore, the electronic device 100 of any of the embodiments of FIGS. 7A, 7B, and 7C lends itself to single-gap, dual-mode (or, multi-level) operation, where the modes include contact between the reflectors 102 and 104, and non-contact between the reflectors 102 and 104. Each pixel is capable of creating multiple colors and intensities as needed for color displays. The pixels operate in a contact mode at one gap extreme, and in a non-contact mode for the remaining states.

When pixels are dedicated to specific hues, such as red, green, and blue, optical efficiency may be reduced, since pixels of the wrong color cannot be used to generate the desired color. Therefore, it is advantageous to control the pixel gap, which is the thickness 108 of FIG. 1A that has been described, in a non-contact mode, such as an analog mode, a multi-level digital mode, or a combination analog and digital mode. The device 100 may need the thickness 108 to be less than 1000 Å to create black, about 1800 Å to create blue, and about 2800 Å to create red. To provide such different thicknesses, a single-gap, voltage control mode of operation that can be utilized is to operate in a non-contact mode between red and blue, and then allow the pixel to snap to the black state in a digital mode.

Figure 8A:
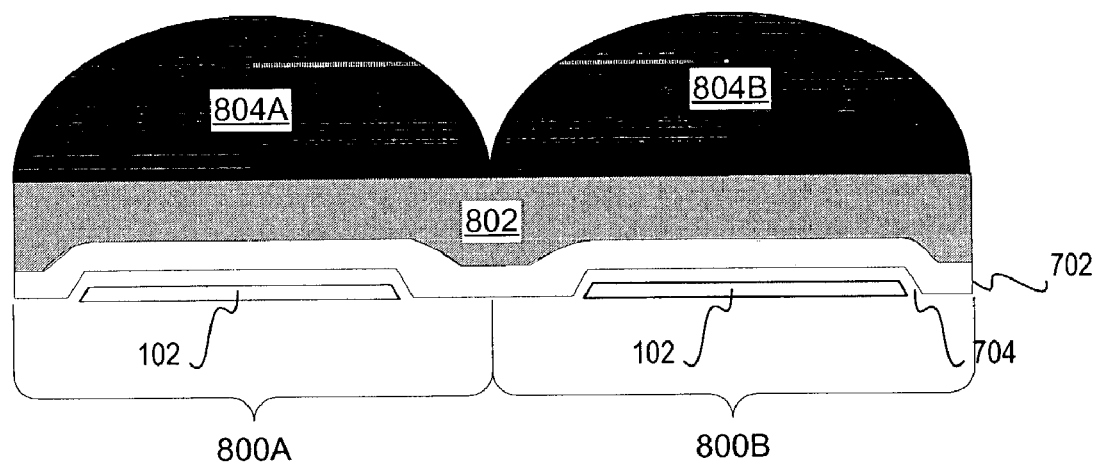
FIGS. 8A and 8B are diagrams of electronic devices that are more specific than but consistent with the electronic device of FIG. 1A, and which include lenses, according to varying embodiments of the invention.
Figure 8B:
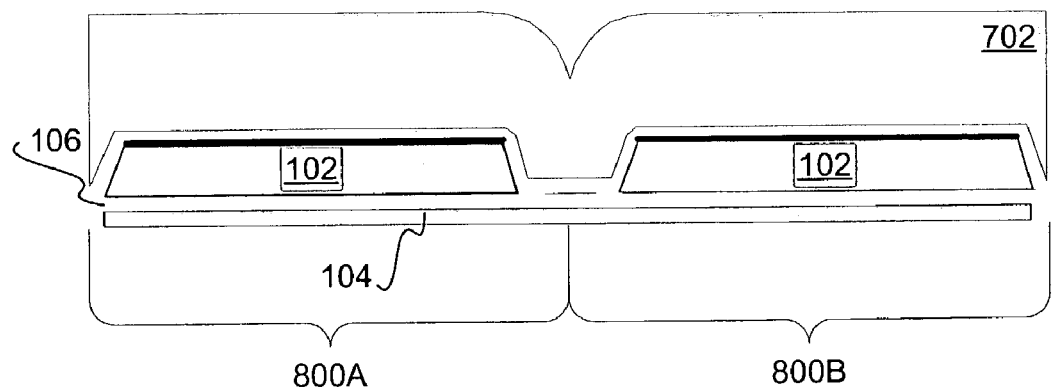

FIGS. 8A and 8B show a pair of electronic devices 800A and 800B for at least partially displaying a corresponding pair of pixels of a displayable image, according to varying embodiment of the invention. Each of the electronic devices 800A and 800B is a specific embodiment of the electronic device 100 of FIG. 1A, and thus the description of FIG. 1A is equally applicable to FIGS. 8A and 8B as well. It is noted that as pixel size is reduced, a smaller aperture ratio usually results. Like-numbered components of FIGS. 8A and 8B relative to FIGS. 1A and 7A-7C are identical, and are not otherwise described with respect to FIGS. 8A and 8B. Further, for illustrative clarity only, not all components of FIGS. 1A and 7A-7C are shown in FIGS. 8A and 8B.

In FIG. 8A, the disadvantage of reduced aperture ratio is overcome by the electronic devices 800A and 800B by employing integral lenses 804A and 804B applied directly to the monolithic MEMS devices 800A and 800B, using coating or depositional techniques. The self-packaging layer 702 provides a substrate for these micro-lenses 804A and 804B, after an initial layer 802 has been deposited. The lenses 804A and 804B can be formed by patterning photoresist or other photo-imageable polymer using known lithographic techniques, and then partially flowing the patterns to the desired lens profile with heat treatment. The polymer may remain as the final lenses, or can be used as a mask to transfer the lens pattern to the underlying layer 802 with plasma or reactive-ion etching. The lenses 804A and 804B can be made more efficient by matching the shape thereof to the underlying pixels.

In FIG. 8B, the self-packaging layer 702 is itself used as a simple form of a micro-lens. Such a technique relies on the coverage of the deposition over the reflector 102 to form a lensing action over the non-active region of the pixel where needed. For the layer 702 to effectively act as a lens, deposition thickness, pixel gap spacing, and pixel plate, or reflector, thickness and profile are desirably optimized. The advantage to the approach of FIG. 8B is that no additional lens is needed, and the lensing action is present only where it is needed, around the non-active region of the pixels.

Anti-stiction Bumps

When two surfaces come into contact, they are frequently attracted to one another by a variety of different forces, such as Van Der Waals attractive forces, chemical bonding forces, capillary forces, and Casimir forces. These forces often lead to surfaces that cannot be separated once they come into contact. Therefore, to prevent the reflectors 102 and 104 of the electronic device 100 from coming into contact with one another, in one embodiment of the invention anti-stiction bumps are placed on the bottom reflector 104 prior to fabrication of the top reflector 102.

Figure 9A:
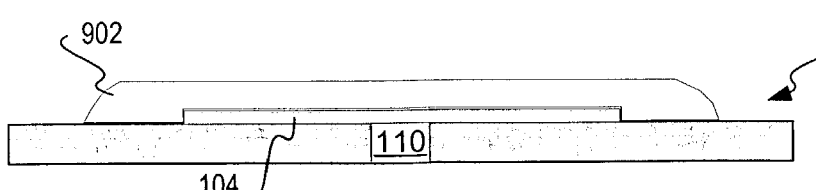
FIGS. 9A, 9B, and 9C are diagrams illustratively depicting how anti-stiction bumps can be fabricated within the electronic device of FIG. 1A, according to an embodiment of the invention.
Figure 9B:
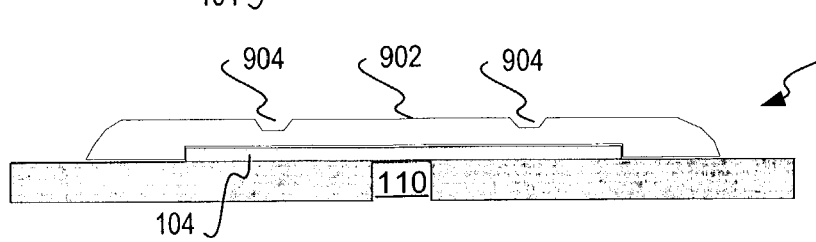
Figure 9C:
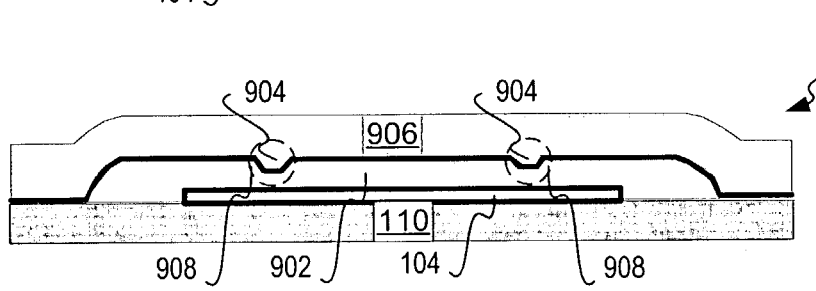

FIGS. 9A, 9B, and 9C illustratively depict the manner by which anti-stiction bumps can be fabricated on the bottom reflector 104, according to one embodiment of the invention. In FIG. 9A, the flexure 110 and the bottom reflector 104 of the electronic device 100 are already present. A sacrificial material 902 is deposited, and then, in FIG. 9B, is patterned and partially etched to yield recesses 904. Subsequent layers, such as the layer 906 in FIG. 9C, are then subsequently deposited into the recessions 904 to yield bumps 908 within the recessions 904.

Figure 10A:
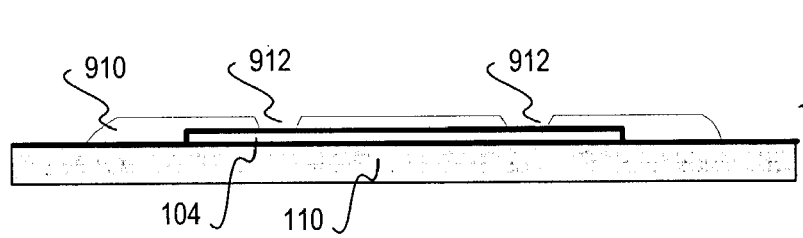
FIGS. 10A, 10B, and 10C are diagrams illustratively depicting how anti-stiction bumps can be fabricated within the electronic device of FIG. 1A, according to another embodiment of the invention.
Figure 10B:
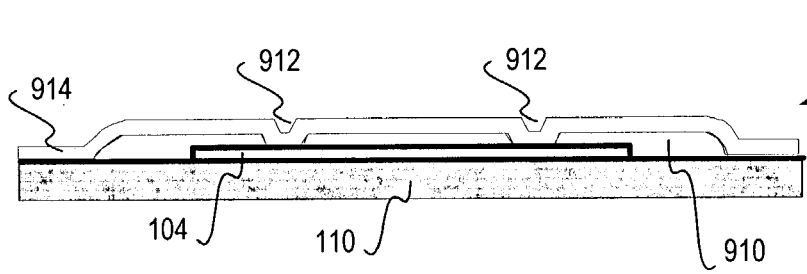
Figure 10C:
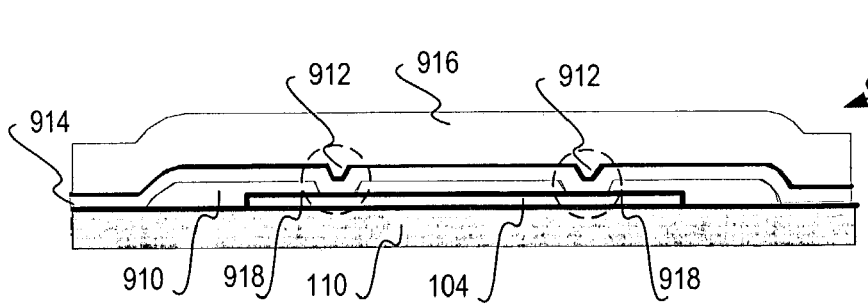

FIGS. 10A, 10B, and 10C illustratively depict the manner by which anti-stiction bumps can be fabricated on the bottom reflector 104, according to another embodiment of the invention. In FIG. 10A, the flexure 110 and the bottom reflector 104 of the electronic device 100 are already present, as before. A first sacrificial material 910 is deposited that has the same thickness of the desired anti-stiction bump height. The material 910 is patterned and etched to yield the recesses 912. In FIG. 10B, a second sacrificial material 914 is deposited to achieve the total sacrificial layer thickness. Finally, in FIG. 10C, subsequent layers, such as the layer 916, are deposited into the recessions 912 to yield bumps 918 within the recessions 912.

Conclusion

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For example, whereas embodiments of the invention have primarily been described as relating to a direct display device, other embodiments are applicable to a projection display device, such that the terminology of displaying a pixel references both of these, as well as additional, such display scenarios. For instance, in projection applications, the pixel size may be on the order of ten-to-twenty microns. Therefore, it is manifestly intended that this invention be limited only by the claims and equivalents thereof.

We claim:

1. An electronic device for at least partially displaying a pixel of a displayable image comprising:
   a first reflector and a second reflector defining an optical cavity therebetween and selective of a visible wavelength at an intensity;
   a mechanism to allow optical properties of the optical cavity to be varied such that at least one of the visible wavelength and the intensity are variably selectable in correspondence with the pixel of the displayable image;
   at least one of:
      one or more transparent deposited films over one of the first and the second reflectors and adapted to self-package the electronic device;
      one or more border mask absorbing layers over one of the first and the second reflectors to reduce undesired reflections by one or more components of the electronic device; and,
      an integral micro-lens over one of the first and the second reflectors;
      one or more anti-stiction bumps between the first and the second reflectors, each anti-stiction bump attached to just one of and not both of the first and the second reflectors.

2. The electronic device of claim 1, further comprising circuitry for controlling a voltage over the first reflector and the second reflector such that the voltage is dependent on a thickness of the optical cavity therebetween.

3. The electronic device of claim 2, wherein the circuitry comprises a voltage source and a capacitor in series with the first reflector and the second reflector.

4. The electronic device of claim 1, further comprising circuitry for controlling a predetermined amount of charge on the first reflector and the second reflector, the circuitry comprising a charge-sharing capacitor.

5. The electronic device of claim 4, wherein the circuitry comprises a voltage source and a second capacitor in parallel with the first reflector and the second reflector, the circuitry switching between the voltage source and the charge-sharing capacitor, and the second capacitor, the first reflector and the second reflector.

6. The electronic device of claim 1, further comprising a controlled current source and circuitry for controlling a time interval that the current source is applied to the first reflector and the second reflector.

7. The electronic device of claim 1, wherein the first reflector is atop, semi-reflective reflector, and the second reflector is a bottom, highly reflective reflector.

8. The electronic device of claim 1, wherein the mechanism allows a thickness of the optical cavity to be varied.

9. The electronic device of claim 1, wherein the mechanism permits one of the first and the second reflectors to move to allow a thickness of the optical cavity to be varied.

10. The electronic device of claim 1, wherein the mechanism comprises a flexure operatively coupled to one of the first and the second reflectors.

11. The electronic device of claim 1, wherein the optical cavity is analog, such that the both the visible wavelength and the intensity are variably selectable in correspondence with the pixel of the displayable image.

12. The electronic device of claim 1, wherein the optical cavity is digital, such that the visible wavelength of which the optical cavity is selective is fixed as a color component wavelength, and the intensity of the color component wavelength is variably selectable in correspondence with a corresponding color component of the pixel of the displayable image.

13. The electronic device of claim 1, wherein the optical cavity is one of reflectively selective and transmissively selective.

14. An electronic device for at least partially displaying a pixel of a displayable image comprising:
   a first reflector and a second reflector defining an optical cavity therebetween and selective of a visible wavelength at an intensity;
   a mechanism to allow optical properties of the optical cavity to be varied such that at least one of the visible wavelength and the intensity are variable selectable in correspondence with the pixel of the displayable image; and,
   border masking means for reducing undesired reflections on one of the first reflector and the second reflector by one or more components of the electronic device.

15. The electronic device of claim 14, wherein the border masking means comprises one or more absorbing layers.

16. An electronic device for at least partially displaying a pixel of a displayable image comprising:
   a first reflector and a second reflector defining an optical cavity therebetween and selective of a visible wavelength at an intensity;
   a mechanism to allow optical properties of the optical cavity to be varied such that at least one of the visible wavelength and the intensity are variable selectable in correspondence with the pixel of the displayable image; and,
   means for self-packaging of the electronic device.

17. The electronic device of claim 16, wherein means comprises one or more transparent deposited films over one of the first reflector and the second reflector.

18. An electronic device for at least partially displaying a pixel of a displayable image comprising:
   a first reflector and a second reflector defining an optical cavity therebetween and selective of a visible wavelength at an intensity;
   a mechanism to allow optical properties of the optical cavity to be varied such that at least one of the visible wavelength and the intensity are variable selectable in correspondence with the pixel of the displayable image; and,
   means for reducing stiction between the first and the second reflectors, and attached to just one of and not both of the first and the second reflectors.

19. The electronic device of claim 18, wherein the means comprises one or more anti-stiction bumps.

20. An electronic device for at least partially displaying a pixel of a displayable image comprising:
   a first reflector and a second reflector defining an optical cavity therebetween and selective of a visible wavelength at an intensity;
   a mechanism to allow optical properties of the optical cavity to be varied such that at least one of the visible wavelength and the intensity are variable selectable in correspondence with the pixel of the displayable image; and,
   means for preventing reduced aperture ratio of one of the first and the second reflectors, and disposed over one of the first and the second reflectors.

21. The electronic device of claim 20, wherein the means comprises an integral micro-lens over the one of the first and the second reflectors.

22. A display device comprising:
a plurality of electrically adjustable optical resonant cavities to correspondingly display a plurality of pixels of a displayable image by optical interference, each cavity comprising at least one of:
one or more transparent deposited films adapted to self-package an electronic device encompassing the cavity;
one or more border mask absorbing layers to reduce undesired reflections by one or more components of the electronic device; and,
an integral micro-lens over one of a first reflector and a second reflector defining the cavity; and,
one or more anti-stiction bumps to reduce stiction between the first and the second reflectors, each anti-stiction bump attached to just one of and not both of the first and the second reflectors.

23. The display device of claim 22, wherein the plurality of cavities are analog, such that each cavity variably selects a visible wavelength at an intensity corresponding to a color and an intensity of a corresponding pixel of the displayable image.

24. The display device of claim 22, wherein the plurality of cavities correspondingly display the plurality of pixels of the displayable image by reflective optical interference.

25. The display device of claim 22, wherein the plurality of cavities correspondingly display the plurality of pixels of the displayable image by transmissive optical interference.

26. The display device of claim 22, wherein the plurality of cavities correspondingly display the plurality of pixels of the displayable image by optical interference of ambient light.

27. The display device of claim 22, wherein the plurality of cavities correspondingly display the plurality of pixels of the displayable image by optical interference of light including light provided by the display device.

28. A method for manufacturing an electronic device for at least partially displaying a pixel of a displayable image comprising:
providing a first reflector and a second reflector defining an optical cavity therebetween and selective of a visible wavelength at an intensity;
providing a mechanism to allow optical properties of the optical cavity to be varied such that at least one of the visible wavelength and the intensity are variably selectable in correspondence with the pixel of the displayable image; and,
providing one or more transparent deposited films over one of the first and the second reflectors adapted to self-package the electronic device.

29. The method of claim 28, further comprising providing one or more absorbing layers over one of the first and the second reflectors to reduce undesired reflections.

30. The method of claim 28, further comprising providing an integral micro-lens over one of the first and the second reflectors.

31. The method of claim 28, further comprising providing one or more anti-stiction bumps between the first and the second reflectors.

* * * * *

UNITED STATES PATENT AND TRADEMARK OFFICE
CERTIFICATE OF CORRECTION

| | |
|---|---|
| PATENT NO. | : 7,370,185 B2 |
| APPLICATION NO. | : 10/428247 |
| DATED | : May 6, 2008 |
| INVENTOR(S) | : Arthur Piehl et al. |

Page 1 of 1

It is certified that error appears in the above-identified patent and that said Letters Patent is hereby corrected as shown below:

In column 17, line 50, in Claim 7, delete "atop" and insert -- a top --, therefor.

Signed and Sealed this

Thirtieth Day of September, 2008

JON W. DUDAS
*Director of the United States Patent and Trademark Office*